United States Patent
Yamaguchi et al.

(10) Patent No.: US 8,252,668 B2
(45) Date of Patent: Aug. 28, 2012

(54) PHOTOELECTRIC CONVERSION DEVICE FABRICATION METHOD

(75) Inventors: Kengo Yamaguchi, Nagasaki (JP); Satoshi Sakai, Kanagawa (JP); Yoshiaki Takeuchi, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 13/003,936

(22) PCT Filed: Aug. 18, 2009

(86) PCT No.: PCT/JP2009/064425
§ 371 (c)(1),
(2), (4) Date: Jan. 30, 2011

(87) PCT Pub. No.: WO2010/061667
PCT Pub. Date: Jun. 3, 2010

(65) Prior Publication Data
US 2011/0111551 A1 May 12, 2011

(30) Foreign Application Priority Data
Nov. 27, 2008 (JP) .................................. 2008-303005

(51) Int. Cl.
*H01L 21/205* (2006.01)
(52) U.S. Cl. ........ 438/485; 136/249; 136/255; 136/258; 136/261; 257/E21.297; 257/E21.316; 438/96; 438/365; 438/482
(58) Field of Classification Search .................. 136/249, 136/255, 258, 261; 257/E21.297, E21.316; 438/96, 365, 482
See application file for complete search history.

(56) References Cited

U.S. PATENT DOCUMENTS

| 5,563,425 | A | * | 10/1996 | Saito et al. ....................... 257/53 |
| 5,720,826 | A | | 2/1998 | Hayashi et al. |
| 6,166,319 | A | | 12/2000 | Matsuyama |
| 6,383,576 | B1 | | 5/2002 | Matsuyama |
| 2005/0103377 | A1 | | 5/2005 | Saneyuki et al. |
| 2005/0229965 | A1 | * | 10/2005 | Nishimura et al. ........... 136/255 |

FOREIGN PATENT DOCUMENTS

| CN | 1213861 A1 | 4/1999 |
| JP | 9051116 A | 2/1997 |
| JP | 11054773 A | 2/1999 |
| JP | 2005159320 A | 6/2005 |
| JP | 2006210558 A | 8/2006 |

OTHER PUBLICATIONS

ISR for PCT/JP2009/064425 dated Nov. 24, 2009.
Office Action for CN 200980128959.0 mailed May 29, 2012.

* cited by examiner

*Primary Examiner* — Asok Sarkar
(74) *Attorney, Agent, or Firm* — Kanesaka Berner & Partners LLP

(57) ABSTRACT

Provided is a photoelectric conversion device fabrication method that realizes both high productivity and high conversion efficiency by rapidly forming an n-layer having good coverage. The fabrication method for a photoelectric conversion device includes a step of forming a silicon photoelectric conversion layer on a substrate by a plasma CVD method. In the fabrication method for the photoelectric conversion device, the step of forming the photoelectric conversion layer includes a step of forming an i-layer formed of crystalline silicon and a step of forming, on the i-layer, an n-layer under a condition with a hydrogen dilution ratio of 0 to 10, inclusive.

10 Claims, 7 Drawing Sheets

FIG. 3
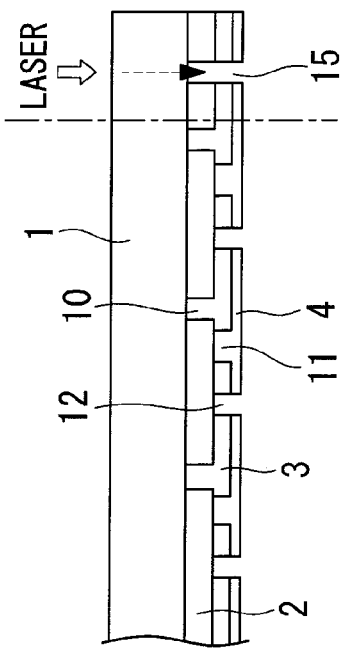
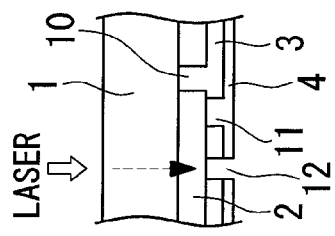
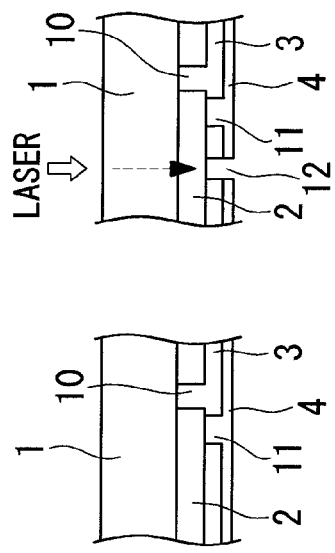

PHOTOELECTRIC CONVERSION DEVICE FABRICATION METHOD

RELATED APPLICATIONS

The present application is national phase of PCT/JP2009/064425 filed Aug. 18, 2009, and claims priority from, Japanese Application Number 2008-303005 filed Nov. 27, 2008.

TECHNICAL FIELD

The present invention relates to a photoelectric conversion device fabrication method and, in particular, to a method for fabricating a thin-film solar cell in which silicon is used for a power generation layer.

BACKGROUND ART

As a photoelectric conversion device used for a solar cell that converts the energy in sunlight into electrical energy, there is a known thin-film silicon photoelectric conversion device having a photoelectric conversion layer fabricated by forming thin films of a p-type silicon semiconductor (p-layer), an i-type silicon semiconductor (i-layer), and an n-type silicon semiconductor (n-layer) by using a plasma CVD method or the like.

In general, when crystalline silicon is used for the i-layer, crystalline silicon is often used for the n-layer, as in PTL 1; however, amorphous silicon may also be used therefor.

Thin-film silicon solar cells have the advantages that the area thereof can be easily increased, and only a small amount of material is used because the film thickness thereof is about one hundredth of that of crystalline solar cells. Therefore, thin-film silicon solar cells can be fabricated at lower cost than crystalline solar cells. However, thin-film silicon solar cells have the disadvantage that the conversion efficiency thereof is lower than that of crystalline solar cells. In this technical field, an improvement in the conversion efficiency is a key issue.

CITATION LIST

Patent Literature

{PTL 1}
Japanese Unexamined Patent Application, Publication No. 2005-159320

SUMMARY OF INVENTION

Technical Problem

When a crystalline silicon n-layer is formed at a film-formation speed of more than 0.15 nm/s in order to improve the productivity of thin-film silicon solar cells, there is a problem in that the form factor and the open circuit voltage decrease, thus reducing the photoelectric conversion efficiency. This tendency is noticeable particularly when the surface of the crystalline silicon i-layer, located under the crystalline silicon n-layer, is rough. It is conceivable that this is because n-type crystalline silicon epitaxially grows on the crystal face of the i-layer, and thus, recesses on the uneven surface of the crystalline silicon i-layer cannot be filled with an n-type semiconductor; therefore, the surface obtained even after the n-layer is formed is not smooth, and the thin crystalline silicon n-layer cannot completely cover the i-layer (coverage is not sufficient).

It is considered that, when amorphous silicon is used for the n-layer, the recesses on the surface of the i-layer are ideally filled with the amorphous silicon n-layer to smooth the surface obtained after the n-layer is formed, thus improving the coverage. However, there arises a problem in that, if the surface of the crystalline silicon i-layer, which is an underlying layer, is rough, the form factor and the open circuit voltage decrease even under a condition with a hydrogen dilution ratio at which amorphous silicon is formed on glass (for example, 20), as in when the crystalline silicon n-layer is formed. It is presumed that this is because the crystalline silicon n-layer is likely to epitaxially grow on the crystal face of the underlying crystalline silicon i-layer, thus causing the difference in the film-formation speed between the amorphous phase and the crystalline phase, and the difference in the crystal growth rate (anisotropy) due to the difference in crystal face.

In order to improve the coverage, it has been generally considered that the high-frequency input power just needs to be reduced to reduce the film-formation speed; in this case, however, the productivity is significantly reduced, and a coverage improvement effect obtained by reducing the film-formation speed is insufficient.

An object of the present invention is to provide a photoelectric conversion device fabrication method that realizes both high productivity and high conversion efficiency by rapidly forming an n-layer having good coverage.

Solution to Problem

In order to solve the above-described problems, the present invention provides a photoelectric conversion device fabrication method including a step of forming a silicon photoelectric conversion layer on a substrate by using a plasma CVD method, in which the step of forming the photoelectric conversion layer includes: a step of forming an i-layer formed of crystalline silicon; and a step of forming, on the i-layer, an n-layer under a condition with a hydrogen dilution ratio of 0 to 10, inclusive.

The inventors of the present invention have found that, in fabricating a photoelectric conversion device by using a plasma CVD method, even if the film-formation speed is not reduced, when a condition with a high partial pressure of $SiH_4$, that is, a hydrogen dilution ratio of 1 to 10, inclusive, is used to form an n-layer, it is possible for the photoelectric conversion device to have high conversion efficiency by improving the form factor and the open circuit voltage thereof. It is presumed that this is because the epitaxial growth of n-type silicon is suppressed in a region where the hydrogen dilution ratio is low even when the underlying layer is crystalline, and therefore, an amorphous silicon n-layer grows over the entire substrate, improving the coverage.

In the above-described invention, it is preferable that the n-layer be formed at a film-formation speed of 0.2 nm/s or more.

According to the present invention, an advantage is afforded because the photoelectric conversion device having high conversion efficiency can be fabricated without reducing the productivity.

In this case, the n-layer may be formed by using gas containing at least one element of carbon and nitrogen, as material gas.

When carbon or nitrogen is added to n-type silicon as an impurity, crystallization of the n-type silicon is prevented. Therefore, when gas containing at least one of carbon and nitrogen is used as material gas to form the n-layer, n-type amorphous silicon can be easily film-formed. As a result, the effect of improving the form factor and the open circuit voltage can be further enhanced.

In this case, the step of forming the n-layer may include a step of forming a first n-layer and a step of forming a second n-layer; the first n-layer may be formed under a condition with a hydrogen dilution ratio of 0 to 10, inclusive; and the second n-layer may be formed under a condition with a hydrogen dilution ratio different from that for the first n-layer.

In particular, if epitaxial growth can be suppressed early in the film formation, it is conceivable that a coverage improvement effect can be obtained. Therefore, as described above, when the n-layer is composed of the first n-layer and the second n-layer, which are formed under conditions of different hydrogen dilution ratios, and when the first n-layer is formed at a hydrogen dilution ratio of 0 to 10, inclusive, it is also possible to fabricate a photoelectric conversion device having high conversion efficiency by improving the form factor and the open circuit voltage.

Advantageous Effects of Invention

According to the present invention, when the n-layer is formed on the crystalline silicon i-layer under a condition with a hydrogen dilution ratio of 0 to 10, it is possible to fabricate a photoelectric conversion device having high conversion efficiency by improving the form factor and the open circuit voltage.

BRIEF DESCRIPTION OF DRAWINGS

FIG. 3 is a view for explaining, in outline, the embodiment in which the solar cell panel is fabricated using the photoelectric conversion device fabrication method of the present invention.

DESCRIPTION OF EMBODIMENTS

Figure 1:
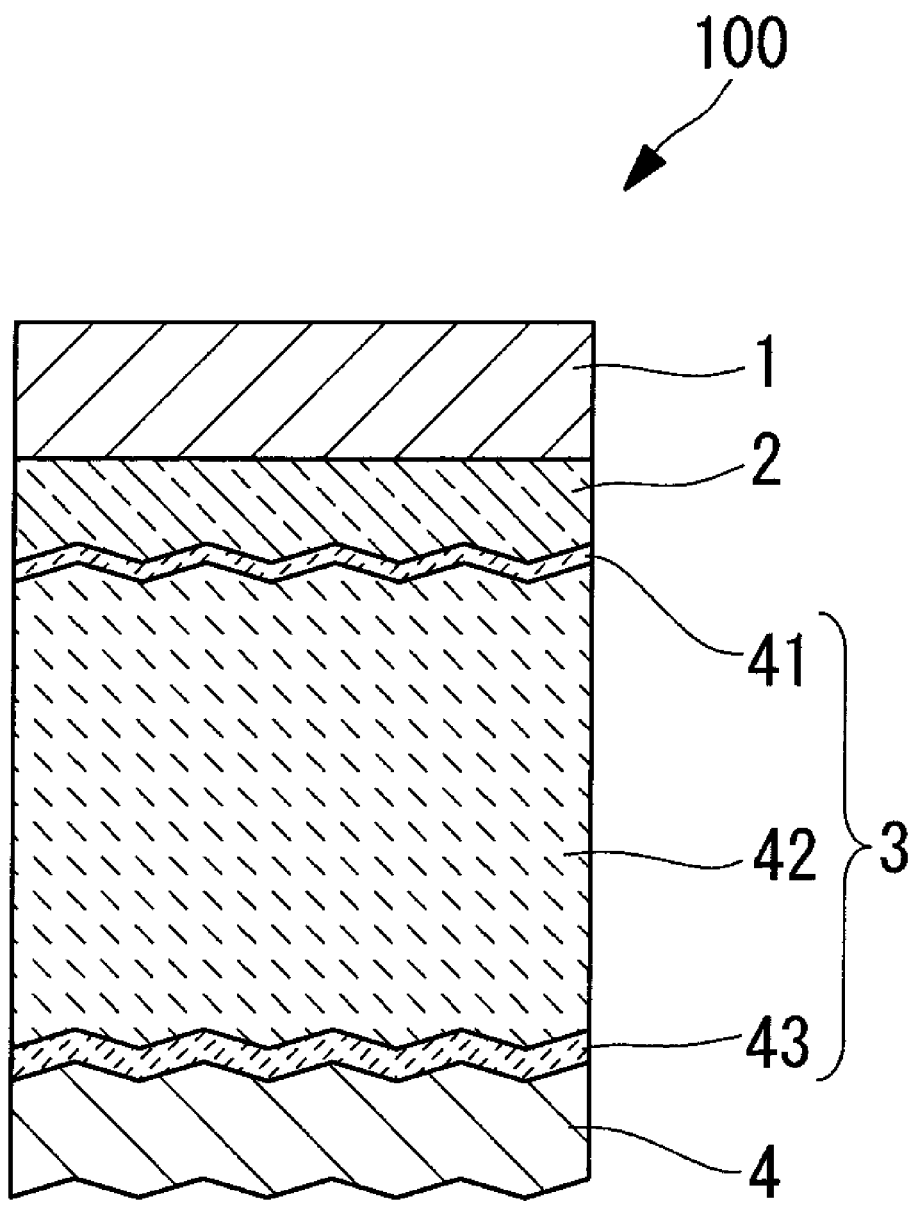
FIG. 1 is a view showing, in outline, the structure of a photoelectric conversion device fabricated by a photoelectric conversion device fabrication method of the present invention.

FIG. 1 is a view showing, in outline, the structure of a photoelectric conversion device of the present invention. A photoelectric conversion device 100 is a single silicon solar cell and includes a substrate 1, a transparent electrode layer 2, a solar-cell photoelectric conversion layer 3 in which a p-layer 41, an i-layer 42, and an n-layer 43 are laminated in this order from the substrate side, and a back electrode layer 4. Here, silicon is a general term including silicon (Si), silicon carbide (SiC), and silicon germanium (SiGe). Further, crystalline silicon is intended to mean silicon other than amorphous silicon and also includes microcrystalline silicon and polycrystalline silicon.

A method for fabricating a photoelectric conversion device according to an embodiment of the present invention will be described by using, as an example, the steps for fabricating a solar cell panel. FIGS. 2 to 5 are views showing, in outline, a method for fabricating a solar cell panel of this embodiment.

(1) FIG. 2(a)

As the substrate 1, a soda float glass substrate having an area of 1 m square or more (for example, 1.4 m×1.1 m×plate thickness: 3.5 mm to 4.5 mm) is used. It is preferable that end faces of the substrate be subjected to a corner chamfering process or an R-chamfering process in order to avoid damage caused by thermal stress, impacts, or the like.

(2) FIG. 2(b)

As the transparent electrode layer 2, a transparent electrode film composed mainly of tin oxide ($SnO_2$) and having a film thickness of about 500 nm to 800 nm, inclusive, is formed at about 500° C. using a thermal CVD apparatus. At this time, a suitable uneven texture is formed on the surface of the transparent electrode film. As the transparent electrode layer 2, in addition to the transparent electrode film, an alkali barrier film (not shown) may be formed between the substrate 1 and the transparent electrode film. The alkali barrier film is obtained when a silicon oxide film ($SiO_2$) having a thickness of 50 nm to 150 nm is formed at about 500° C. using a thermal CVD apparatus.

(3) FIG. 2(c)

Thereafter, the substrate 1 is placed on an X-Y table and is irradiated with the first harmonic (1064 nm) of a YAG laser from the film surface of the transparent electrode film, as shown by the arrow in the figure. The laser power is adjusted so as to be appropriate for the processing speed, and the laser light is moved relative to the substrate 1, over the transparent electrode film in a direction perpendicular to the series-connection direction of power generation cells, thus applying laser etching so as to form a groove 10 into a rectangular shape with a predetermined width of about 6 mm to 15 mm.

(4) FIG. 2(d)

The p-layer 41, the i-layer 42, and the n-layer 43 are sequentially formed by using a plasma CVD apparatus, under the following conditions: a material gas of hydrogen and silane ($SiH_4$), a low-pressure atmosphere of 3000 Pa or less, a substrate temperature of about 200° C., and a plasma generation frequency of 40 MHz to 100 MHz, inclusive. The crystalline silicon p-layer 41 is formed mainly of B-doped microcrystalline silicon and has a film thickness of 10 nm to 50 nm, inclusive. The crystalline silicon i-layer 42 is formed mainly of microcrystalline silicon and has a film thickness of 1.2 μm to 3.0 μm, inclusive.

The n-layer 43 is formed mainly of P-doped silicon and has a film thickness of 20 nm to 50 nm, inclusive. In the film-formation of the n-layer 43, the hydrogen dilution ratio $H_2/SiH_4$ is 0 to 10, inclusive. The film-formation speed for the n-layer is 0.2 nm/s or more, and preferably, 0.25 nm/s or more.

When the n-layer 43 is formed, gas containing at least one element of carbon and nitrogen may be further introduced, as material gas, to the plasma CVD apparatus. Examples of the above-described gas include methane gas and nitrogen gas. The additive amount of methane gas to silane is set, in terms of flow ratio, at 0.2% to 1.2%, inclusive, and preferably, at 0.5% to 0.8%, inclusive. The additive amount of nitrogen gas to silane is set, in terms of flow ratio, at 0.2% to 3%, inclusive, and preferably, at 0.5% to 2%, inclusive. In this way, by using gas that contains at least one element of carbon and nitrogen as material gas to form the n-layer, carbon and nitrogen form a Si—C bond and a Si—N bond, respectively, thereby preventing silicon crystallization.

The n-layer 43 may be composed of a single layer formed under a fixed hydrogen-dilution-ratio condition within the above-described range or may be composed of two laminated layers formed under different hydrogen-dilution-ratio conditions.

When the n-layer 43 is composed of two layers, a first n-layer is formed on the crystalline silicon i-layer 42 under a condition with a hydrogen dilution ratio of 0 to 10, inclusive. To form the first n-layer, the above-described gas that contains at least one element of carbon and nitrogen may also be used. A second n-layer is formed at a hydrogen dilution ratio different from that for the first n-layer. At that time, forming the second n-layer at a high film-formation speed, under a hydrogen-dilution-ratio condition with which amorphous silicon is formed (for example, 20), is an advantage because it should improve the productivity and should also improve the coverage.

When the i-layer formed mainly of microcrystalline silicon is formed by using the plasma CVD method, it is preferable to set a distance d between the plasma discharge electrode and the surface of the substrate 1 at 3 mm to 10 mm, inclusive. When it is less than 3 mm, it becomes difficult to keep the distance d constant because of the precision of individual constituent devices in a film-formation chamber compatible with large substrates, and there is a risk of the discharge becoming unstable when they get too close to each other. When it is more than 10 mm, it is difficult to achieve an adequate film-formation speed (1 nm/s or more), the plasma uniformity decreases, and the film quality is reduced due to ion bombardment.

Figure 2:
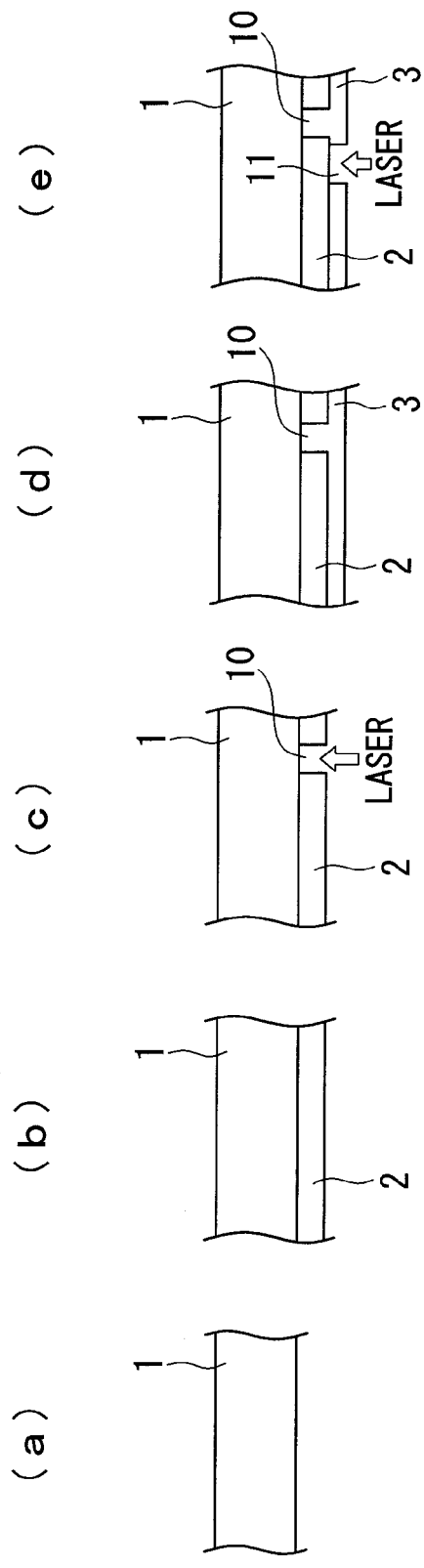
FIG. 2 is a view for explaining, in outline, one embodiment in which a solar cell panel is fabricated using the photoelectric conversion device fabrication method of the present invention.

(5) FIG. 2(*e*)

The substrate 1 is placed on the X-Y table and is irradiated with the second harmonic (532 nm) of a laser-diode-pumped YAG laser from the film surface side of the photoelectric conversion layer 3, as shown by the arrow in the figure. The laser power is adjusted such that the processing speed becomes appropriate, with a pulse oscillation of 10 kHz to 20 kHz, and laser etching is performed so as to form a groove 11 at a position about 100 µm to 150 µm away laterally from a laser etching line on the transparent electrode layer 2. The laser may be radiated from the substrate 1 side, and in this case, because the photoelectric conversion layer 3 can be etched using high-pressure vapor generated with the energy absorbed in the first power generation cell layer, formed of amorphous silicon, of the photoelectric conversion layer 3, it is possible to perform laser etching even more stably. The position of the laser etching line is selected in consideration of the positional tolerance so as not to intersect the etching line in the previous step.

(6) FIG. 3(*a*)

As the back electrode layer 4, an Ag film/Ti film are formed by using a sputtering apparatus with a low-pressure atmosphere and a film-forming temperature of 150° C. to 200° C. In this embodiment, an Ag film having a film thickness of 150 nm to 500 nm, inclusive, and a Ti film having a film thickness of 10 nm to 20 nm, inclusive, which has a high anti-corrosion effect and serves to protect the Ag film, are laminated in this order. Alternatively, the back electrode layer 4 may have a laminated structure of an Ag film having a film thickness of 25 nm to 100 nm and an Al film having a film thickness of 15 nm to 500 nm. In order to improve the light reflectivity and reduce the contact resistance of the n-layer 43 and the back electrode layer 4, a GZO (Ga-doped ZnO) film having a film thickness of 50 nm to 100 nm, inclusive, may be formed between the photoelectric conversion layer 3 and the back electrode layer 4, using a sputtering apparatus.

(7) FIG. 3(*b*)

The substrate 1 is placed on the X-Y table and is irradiated with the second harmonic (532 nm) of a laser-diode-pumped YAG laser from the substrate 1 side, as shown by the arrow in the figure. The laser light is absorbed in the photoelectric conversion layer 3, and the back electrode layer 4 is removed by blasting using the high gas vapor pressure generated during this process. The laser power is adjusted so as to be appropriate for the processing speed, with a pulse oscillation of 1 kHz to 10 kHz, inclusive, and laser etching is performed so as to form a groove 12 at a position 250 µm to 400 µm away laterally from the laser etching line on the transparent electrode layer 2.

Figure 4:
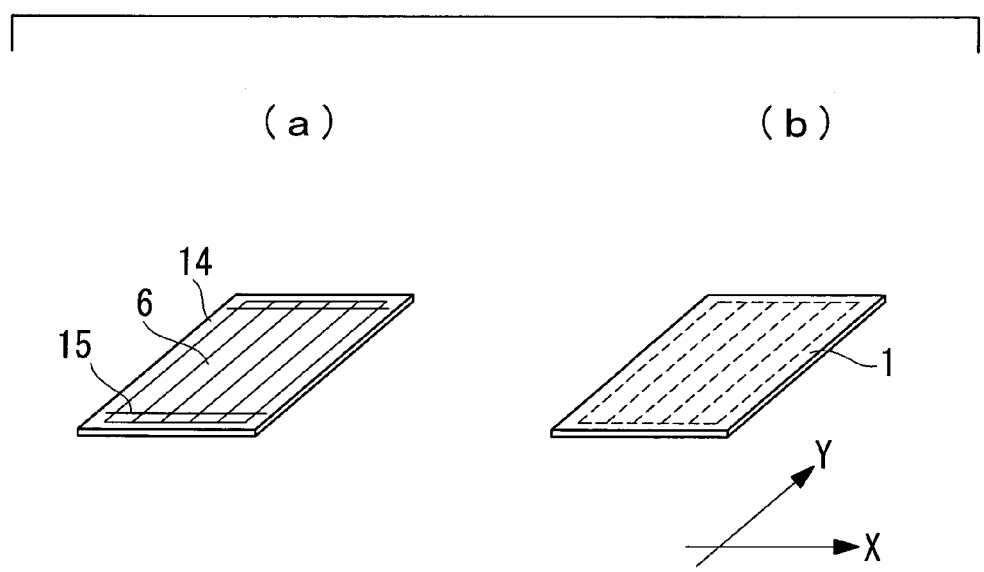
FIG. 4 is a view for explaining, in outline, the embodiment in which the solar cell panel is fabricated using the photoelectric conversion device fabrication method of the present invention.
Figure 5:
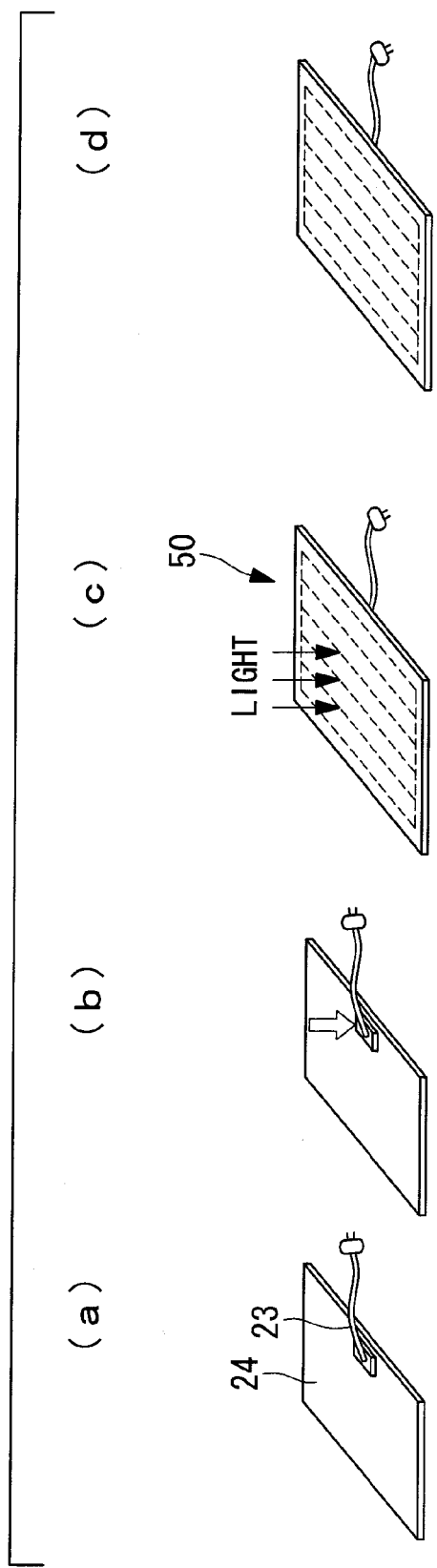
FIG. 5 is a view for explaining, in outline, the embodiment in which the solar cell panel is fabricated using the photoelectric conversion device fabrication method of the present invention.

(8) FIG. 3(*c*) and FIG. 4(*a*)

The power generation region is divided to remove the influence of the risk of short-circuiting the series-connected portions produced through laser etching at film edge portions near the substrate edges. The substrate 1 is placed on the X-Y table and is irradiated with the second harmonic (532 nm) of a laser-diode-pumped YAG laser from the substrate 1 side. The laser beam is absorbed in the transparent electrode layer 2 and the photoelectric conversion layer 3, and the back electrode layer 4 is blasted using the high gas vapor pressure generated during this process, thereby removing the back electrode layer 4/the photoelectric conversion layer 3/the transparent electrode layer 2. The laser power is adjusted so as to be appropriate for the processing speed, with a pulse oscillation of 1 kHz to 10 kHz, inclusive, and laser etching is performed so as to form an X-direction insulating groove 15 at a position 5 mm to 20 mm away from the edge of the substrate 1, as shown in FIG. 3(*c*). Note that, since FIG. 3(*c*) is an X-direction sectional view seen from the direction in which the photoelectric conversion layers 3 are serially connected, a surrounding film-removed region 14 where the back electrode layer 4/the photoelectric conversion layer 3/and the transparent electrode layer 2 are removed through film polishing should be located at the position of the insulating groove 15 (see FIG. 4(*a*)); however, for the sake of convenience in explaining processing applied to the edge of the substrate 1, a description will be given of a case where a Y-direction section is shown at this position and the formed insulating groove is shown as the X-direction insulating groove 15. At this time, it is not necessary to provide a Y-direction insulating groove because a film-surface polishing and removing process is applied to the surrounding film-removed region on the substrate 1 at a later step.

Terminating the etching for the insulating groove 15 at positions 5 mm to 15 mm away from the edges of the substrate 1 is preferable because it affords an advantageous effect in that it is effective to suppress the ingress of external moisture from the solar cell panel edge into the interior of a solar cell module 6.

Note that a YAG laser is used as laser light in the above-described steps; however, a YVO4 laser or a fiber laser can be similarly used.

(9) FIG. 4(*a*: a view seen from the solar-cell film surface side and *b*: a view seen from the substrate side, which is a light-receiving surface)

Since the laminated films at the regions surrounding the substrate 1 (at the surrounding film-removed region 14) are uneven and likely to be peeled off, the films are removed to form the surrounding film-removed region 14, in order to provide a sound joining/sealing surface with a back sheet 24 via an EVA in a later step. The films are removed in the whole surrounding region with a width of 5 to 20 mm from the edges of the substrate 1. More specifically, the back electrode layer 4/the photoelectric conversion layer 3/the transparent electrode layer 2 are removed through grindstone polishing or blast polishing in portions closer, in the X direction, to the substrate edges than the insulating groove 15 provided in the above-described step shown in FIG. 3(c) and in portions closer, in the Y direction, to the substrate edges than the grooves 10 that are formed near the substrate edges.

Polishing dust or abrasive grains are removed by washing the substrate 1.

(10) FIGS. 5(a) and 5(b)

An opening pass-through window is provided in the back sheet 24 at a position where a terminal housing 23 is mounted, to lead out a current-collecting plate. A plurality of layers, formed of an insulating material, are provided for the opening pass-through window to suppress the ingress of external moisture etc.

Processing is performed so as to collect power, using copper foil, from the serially-arranged solar-cell power generation cells at one end and at the other end and to take out the power from the portion of the terminal housing 23 provided at the rear side of the solar cell panel. An insulating sheet having a larger width than the copper foil is disposed in order to prevent a short circuit between the copper foil and each part.

After the power-collecting copper foil etc. are disposed at predetermined locations, an adhesive packing sheet, such as EVA (ethylene vinyl acetate copolymer), is disposed so as to cover the entire solar cell module 6 and so as not to stick out from the substrate 1.

The back sheet 24, having a high waterproofing effect, is provided on the EVA. In this embodiment, the back sheet 24 is formed into a three-layer structure of PET sheet/Al foil/PET sheet, so as to achieve a high waterproofing and damp-proofing effect.

After the back sheet 24 is disposed at the predetermined location, while the inner air is deaerated in the low-pressure atmosphere by means of a laminator and pressing is performed at about 150 to 160° C., the EVA is cross-linked for sealing.

(11) FIG. 5(a)

The terminal housing 23 is mounted on the rear side of the solar cell module 6 with an adhesive agent.

(12) FIG. 5(b)

The copper foil and an output cable of the terminal housing 23 are connected by solder or the like, and the inside of the terminal housing 23 is filled with sealant (potting material) and sealed. Thus, a solar cell panel 50 is completed.

(13) FIG. 5(c)

A power generation check and predetermined performance tests are executed for the solar cell panel 50, formed through the steps up to the step shown in FIG. 5(b). The power generation check is executed using a solar simulator for an AM of 1.5 and global-solar-radiation standard sunlight (1000 W/m$^2$).

(14) FIG. 5(d)

Before or after the power generation check (FIG. 5(c)), predetermined performance tests, such as a visual inspection, are executed.

EXAMPLE

Example 1

A single solar cell having the structure shown in FIG. 1 was fabricated.

As the transparent electrode layer, a tin oxide film having a film thickness of 80 nm was formed on the glass substrate.

The crystalline silicon p-layer was formed using $H_2$, $SiH_4$, and $B_2H_6$, as material gas, under the following conditions: a hydrogen dilution ratio of 100, a pressure of 500 Pa, a substrate temperature of 180° C., a plasma generation frequency of 60 MHz, and a film thickness of 20 nm.

The crystalline silicon i-layer was formed using $H_2$ and $SiH_4$, as material gas, under the following conditions: a hydrogen dilution ratio of 45, a pressure of 2100 Pa, a substrate temperature of 180° C., a plasma generation frequency of 100 MHz, and a film thickness of 0.5 μm or 1.9 μm.

As the back electrode layer, a ZnO film having a film thickness of 70 nm and an Ag film having a film thickness of 250 nm were formed.

The n-layer was formed using $H_2$, $SiH_4$, and $PH_3$, as material gas, under the following conditions: a hydrogen dilution ratio of 5 to 50, a pressure of 250 to 700 Pa, a substrate temperature of 180° C., a plasma generation frequency of 60 MHz, and a film thickness of 30 nm. For the film-formation of the n-layer, an input power was adjusted such that the film-formation speed became 0.2 nm/s.

Figure 6:
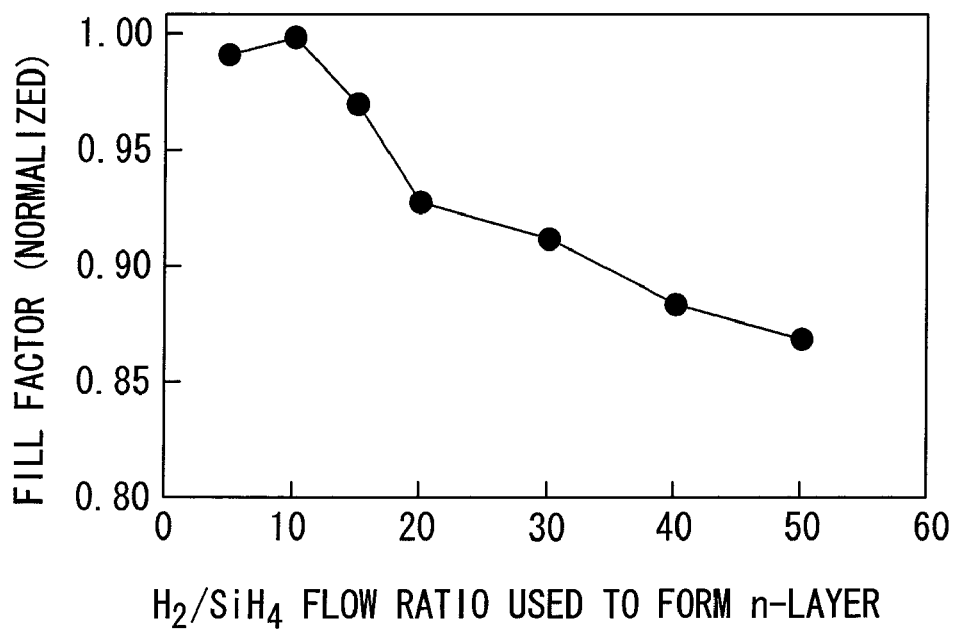
FIG. 6 is a graph showing the correlation between the hydrogen dilution ratio used to form an n-layer and the fill factor, in a solar cell in which the film thickness of a crystalline silicon i-layer is 0.5 μm.
Figure 7:
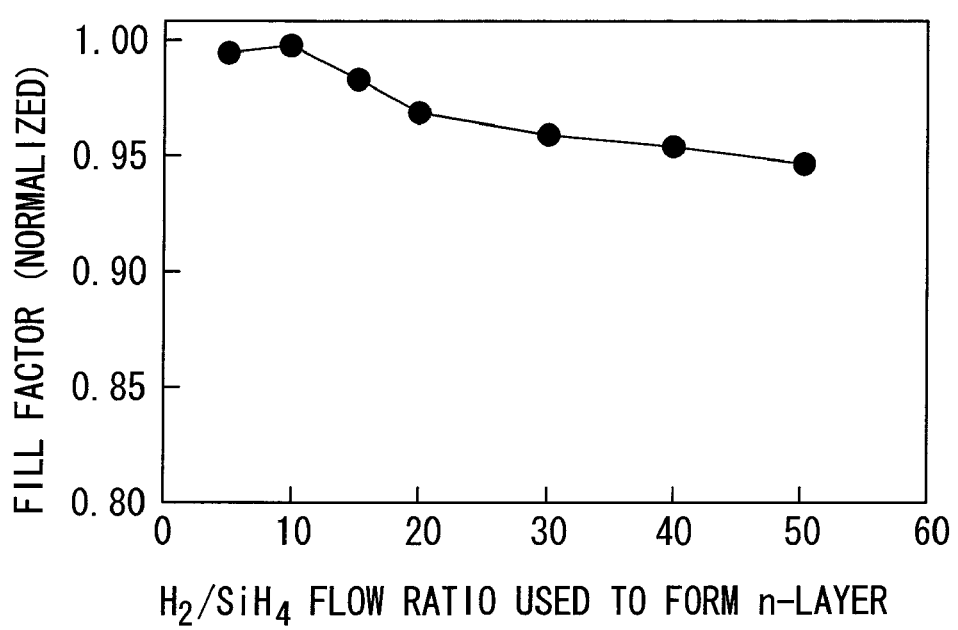
FIG. 7 is a graph showing the correlation between the hydrogen dilution ratio used to form the n-layer and the fill factor, in a solar cell in which the film thickness of the crystalline silicon i-layer is 1.9 μm.

FIG. 6 is a graph showing the correlation between the hydrogen dilution ratio used to form the n-layer and the fill factor, in a solar cell in which the film thickness of the crystalline silicon i-layer was 0.5 μm. FIG. 7 is a graph showing the correlation between the hydrogen dilution ratio used to form the n-layer and the solar-cell fill factor, in a solar cell in which the film thickness of the crystalline silicon i-layer was 1.9 μm. In FIGS. 6 and 7, the horizontal axis shows the $H_2/SiH_4$ flow ratio used to form the n-layer, and the vertical axis shows the solar-cell fill factor (normalized by a value of the fill factor when the hydrogen dilution ratio was 10).

As shown in FIGS. 6 and 7, a high fill factor was obtained when the hydrogen dilution ratio used to form the n-layer was 10 or less. Further, when the hydrogen dilution ratio exceeded 10, the fill factor decreased as the hydrogen dilution ratio was increased. It is predicted that the fill factor was improved because n-type silicon did not epitaxially grow and was film-formed even at recesses of the uneven shape on the surface of the crystalline silicon i-layer. Further, the tendency of the fill factor to increase as the hydrogen dilution ratio became smaller was noticeable as the crystalline silicon i-layer became thinner. It is conceivable that this was because the surface of the i-layer became flatter as the crystalline silicon i-layer became thicker.

The result of Example 1 shows that the photoelectric conversion efficiency can be improved when the hydrogen dilution ratio for forming the n-layer is set at 0 to 10, inclusive.

Example 2

A single solar cell was fabricated by forming the transparent electrode layer, the crystalline silicon p-layer, the crystalline silicon i-layer, and the back electrode layer, under conditions similar to those of Example 1, except the n-layer. Note that the film thickness of the crystalline silicon i-layer was 1.9 μm.

The n-layer was formed using $H_2$, $SiH_4$, $PH_3$, and $CH_4$, as material gas, under the following conditions: a hydrogen dilution ratio of 10, a $CH_4/SiH_4$ flow ratio of 0 to 8%, a pressure of 250 Pa, a substrate temperature of 180° C., a plasma generation frequency of 60 MHz, and a film thickness of 30 nm. For film-forming of the n-layer, the input power was adjusted such that the film-formation speed became 0.2 nm/s.

Example 3

A single solar cell was fabricated in a manner similar to Example 2 except that, for film-formation of the n-layer, $H_2$, $SiH_4$, $PH_3$, and $N_2$ were used as material gas, and a $N_2/SiH_4$ flow ratio was set at 0 to 5%.

Figure 8:
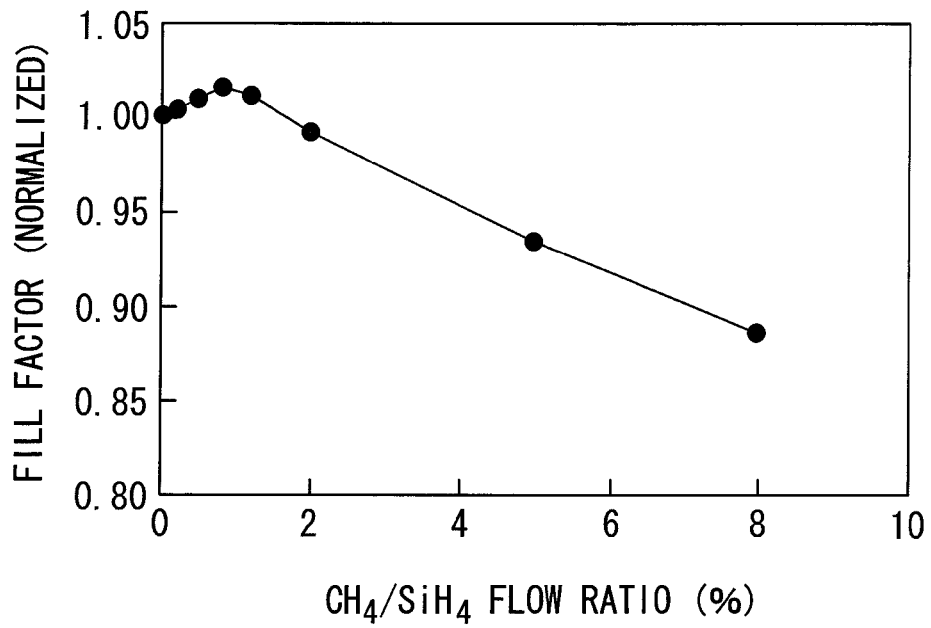
FIG. 8 is a graph showing the relationship between the $CH_4/SiH_4$ flow ratio used to form the n-layer and the fill factor.
Figure 9:
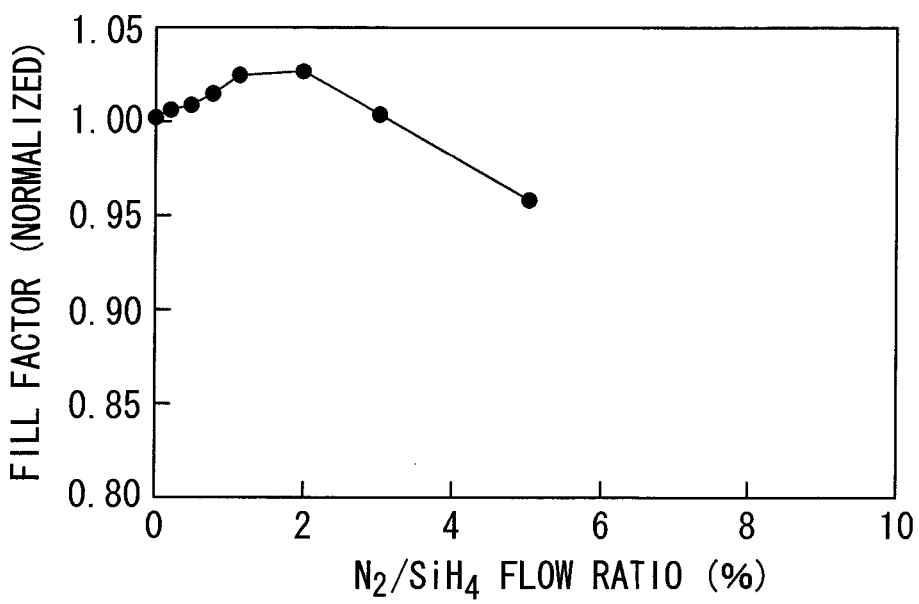
FIG. 9 is a graph showing the relationship between the $N_2/SiH_4$ flow ratio used to form the n-layer and the fill factor.

FIG. 8 is a graph showing the relationship between the $CH_4/SiH_4$ flow ratio used to form the n-layer and the fill factor, in the solar cell of Example 2. In the figure, the horizontal axis shows the $CH_4/SiH_4$ flow ratio, and the vertical axis shows the solar-cell fill factor normalized by a value of the fill factor when the $CH_4/SiH_4$ flow ratio was 0.2%. FIG. 9 is a graph showing the relationship between the $N_2/SiH_4$ flow ratio used to form the n-layer and the fill factor, in the solar cell of Example 3. In the figure, the horizontal axis shows the $N_2/SiH_4$ flow ratio, and the vertical axis shows the solar-cell fill factor normalized by a value of the fill factor when the $N_2/SiH_4$ flow ratio was 0.5%.

From the results of FIG. 8 and FIG. 9, when $CH_4$ or $N_2$ was added to material gas at a $CH_4/SiH_4$ flow ratio of 0.5% to 1.2%, inclusive, or at an $N_2/SiH_4$ flow ratio of 0.5% to 3%, inclusive, respectively, the form factor was improved. It is conceivable that the reason the form factor was improved was because the amorphous silicon n-layer was formed on the crystalline silicon i-layer, improving the coverage.

In the above-described embodiment, a description has been given of a single solar cell serving as a solar cell; however, the present invention is not limited thereto. For example, the present invention can be similarly applied to another type of thin-film solar cell, such as a tandem solar cell, a silicon germanium solar cell, or a triple solar cell.

The invention claimed is:

1. A photoelectric conversion device fabrication method comprising forming a silicon photoelectric conversion layer on a substrate by using a plasma chemical vapor deposition (CVD) method, wherein
the forming the photoelectric conversion layer comprises:
forming an i-layer of crystalline silicon;
forming a first n-layer on the i-layer under a condition with a first hydrogen dilution ratio of 0 to 10, inclusive, and
forming a second n-layer on the first n-layer under a condition with a second hydrogen dilution ratio different from the first hydrogen dilution ratio.

2. A photoelectric conversion device fabrication method according to claim 1, wherein at least one of the first n-layer or the second n-layer is formed at a deposition rate of 0.2 nm/s or more.

3. A photoelectric conversion device fabrication method according to claim 2, wherein the first n-layer is formed of amorphous silicon.

4. A photoelectric conversion device fabrication method according to claim 2, wherein both the first and second n-layers are formed of amorphous silicon.

5. A photoelectric conversion device fabrication method according to claim 1, wherein the first n-layer is formed by using a material gas containing at least one element selected from the group consisting of carbon and nitrogen.

6. A photoelectric conversion device fabrication method according to claim 1, wherein
the first n-layer is formed by using a material gas containing hydrogen gas, silane ($SiH_4$) gas, and methane gas, and
a flow ratio of the methane gas to the $SiH_4$ gas is 0.2% to 1.2%, inclusive.

7. A photoelectric conversion device fabrication method according to claim 1, wherein the second hydrogen dilution ratio is higher than the first hydrogen dilution ratio.

8. A photoelectric conversion device fabrication method according to claim 1, wherein
the i-layer is formed mainly of microcrystalline silicon, and
the first and second n-layers are formed mainly of P-doped silicon.

9. A photoelectric conversion device fabrication method according to claim 1, further comprising forming a crystalline silicon p-layer on the substrate by using a plasma CVD method prior to forming the photoelectric conversion layer, wherein
the p-layer is formed mainly of B-doped microcrystalline silicon on the substrate,
the i-layer is formed mainly of microcrystalline silicon, and
the first and second n-layers are formed mainly of P-doped silicon.

10. A photoelectric conversion device fabrication method according to claim 1, wherein the first hydrogen dilution ratio of 0 to 10, inclusive, prevents a formation of crystalline silicon in the first n-layer.

* * * * *